United States Patent [19]

Kimura et al.

[11] Patent Number: 4,571,502
[45] Date of Patent: Feb. 18, 1986

[54] FULL WAVE RECTIFIER HAVING AN OPERATIONAL AMPLIFIER

[75] Inventors: Tadakatsu Kimura; Takayoshi Makabe; Yoshiaki Kuraishi, all of Tokyo, Japan

[73] Assignees: Nippon Telegraph & Telephone Public Corporation; Nippon Electric Co., Ltd., both of Tokyo, Japan

[21] Appl. No.: 446,865

[22] Filed: Dec. 6, 1982

[30] Foreign Application Priority Data

Dec. 9, 1981 [JP] Japan .................. 56-197852

[51] Int. Cl.[4] .................. H03K 5/00; H03F 3/16
[52] U.S. Cl. .................. 307/262; 328/26; 363/127; 307/571; 307/497
[58] Field of Search ............ 307/260, 261, 262, 571, 307/494, 497; 363/127; 328/26

[56] References Cited

U.S. PATENT DOCUMENTS 3,958,170  5/1976  Hodgson .................. 363/127

OTHER PUBLICATIONS

"Designing with Operational Amplifiers", by Jerald Graeme, McGraw-Hill, 1977, chapter 5.
"Applications of MOSFET's in Microelectronics", by R. D. Lohman, Solid State Technology, 3/1966, pp. 23-29.
MOS Field-Effect Transistors and Integrated Circuits, 1973, by Paul Richman.
Electronic Engineering, Jun. 1980, "Precision Rectification", by D. Bowers, pp. 71-84.

Primary Examiner—Stanley D. Miller
Assistant Examiner—Richard Roseen
Attorney, Agent, or Firm—Laff, Whitesel, Conte & Saret

[57] ABSTRACT

A full wave rectifier comprises an input terminal supplied with an AC signal and an output terminal for delivering a rectified DC signal. An operational amplifier having an inverting input terminal, amplifies the AC signal. A rectifier gain setting is provided by a first resistor connected between the input terminal and the inverting terminal of the amplifier. A second resistor, having the same resistance as the first resistor, is connected between the inverting terminal and output terminal of the amplifier. A depletion type MOS FET operates responsive to the output of the amplifier, for performing a switching operation.

5 Claims, 4 Drawing Figures

FULL WAVE RECTIFIER HAVING AN OPERATIONAL AMPLIFIER

This invention relates to a full wave rectifier suitable for construction in an integrated circuit form.

A typical example of full wave rectifiers for direct current (DC) to alternate current (AC) conversion is a diode bridge circuit. The full wave rectifier relying on the bridge circuit encounters a problem that sufficient rectification cannot be achieved due to the temperature dependency of the forward voltage drop caused by the four diodes of the circuit. To eliminate such an undesirable voltage drop, another full wave rectifier employing one operational amplifier (op-amp) is described in a paper entitled "Precision Rectification" by D. Bowers, published in the ELECTRONIC ENGINEERING, pp. 71–84, June, 1980.

The rectifier shown in FIG. 6 on page 77 of the Bowers paper, comprises an op-amp A1, a diode D1 connected with the output of the op-amp A1, resistors $R_1$ and $R_2$ for setting the gain of the op-amp A1, and a load resistor $R_L$. However, since this rectifier still requires one diode D1, responsive to the output of the op-amp A1, for performing the switching operation, there is an appreciable amount of voltage drop across the diode, with an insufficient rectification. Besides, the use of the diode D1 prevents the manufacture of the entire circuit by an MOS (metal oxide semiconductor) IC technique, resulting in a bulky rectifier.

An object of the invention is, therefore, to provide a full wave rectifier which is suitable for MOS integration, to achieve a wide range of rectification.

According to an aspect of this invention, a full wave rectifier has an input terminal which is supplied with an AC signal and a rectifier output terminal for delivering a rectified DC signal. An operational amplifier amplifies the AC signal, the amplifier having an inverting input terminal, a non-inverting input terminal grounded and an output terminal. A rectifier gain setting means includes a first resistor which is connected between the inverting input terminal of the amplifier and the rectifier input terminal. A second resistor has the same resistance as that of the first resistor and is connected between the inverting input terminal of the amplifier and the rectifier output terminal. A depletion type MOS FET responds to the output of the amplifier for performing a switching operation.

The present invention will be described in detail with reference to the accompanying drawings in which.

Figure 1:
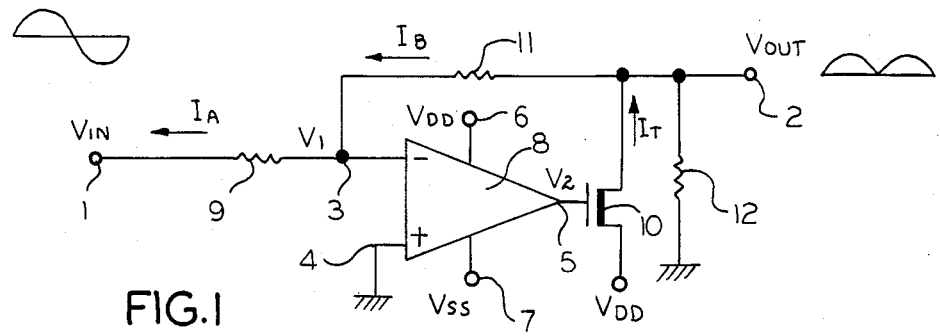
FIG. 1 is a circuit diagram showing one embodiment of the invention.

Referring to FIG. 1, the embodiment includes a rectifier input terminal 1 supplied with an AC voltage; a rectifier output terminal 2 for delivering a rectified DC voltage; an op-amp 8 having an inverting input terminal 3, a non-inverting input terminal 4 which is grounded, and an output terminal 5. A depletion type MOS FET 10 responds to the output of the op-amp 8 for performing the switching operation. A rectifier gain setting means is provided in the form of resistors 9 and 11.

Figure 2:
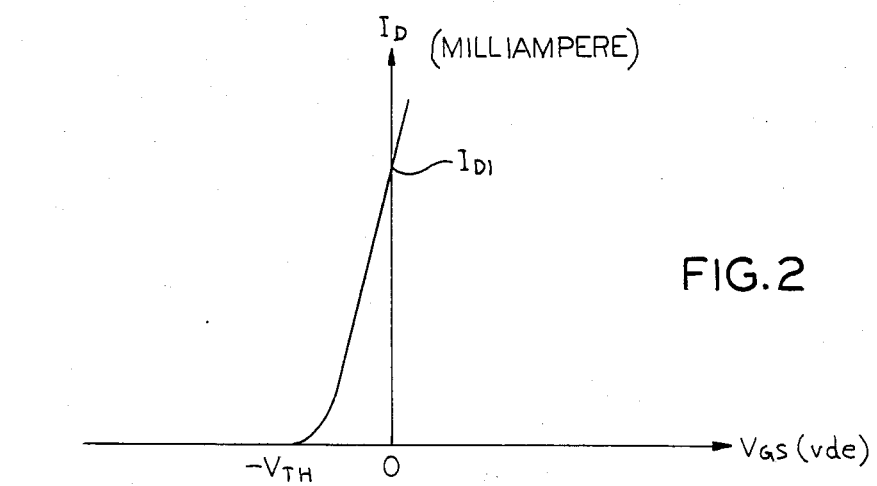
FIG. 2 is a graph of a drain current ($I_D$) vs. gate-source voltage ($V_{GS}$) characteristic of an FET used in the embodiment of FIG. 1.

Referring to FIG. 2, a voltage ($V_{GS}$) vs. current ($I_D$) characteristic of the MOS FET 10 clearly indicates that the FET 10 causes a forward voltage drop only when voltage $V_{GS}$ becomes equal to or greater than zero to produce a drain current $I_D$ which is equal to or greater than $I_{D1}$. For this reason, in the embodiment, the FET 10 is operated within the range of voltage negative $V_{GS}$. The gain (or the ratio of the output to input) of the present full wave rectifier is set at "1" by employing the same resistance for the two resistors 9 and 11. The op-amp 8 receiver at its terminals 6 and 7, respectively, the operating voltages $V_{DD}$ and $V_{SS}$ shown in FIG. 3 the voltages being supplied from a DC power source (not shown).

Figure 3:
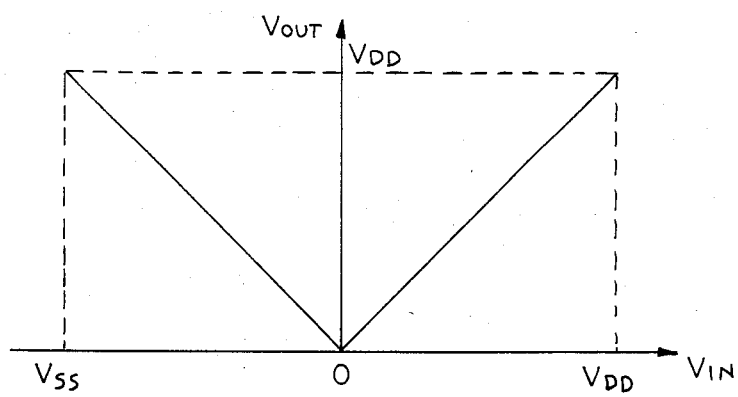
FIG. 3 is a graph of a rectification characteristic achieved with the embodiment.

The operation of the embodiment will be described with reference to FIGS. 1, 2, and 3.

Suppose that the voltages applied to the terminals 6 and 7 of the op-amp 8 are $V_{DD}$ and $V_{SS}$, respectively; the input and output voltages of the (FIG. 3) rectifier are $V_{in}$ and $V_{out}$, respectively; the voltage at a junction 3 between the resistors 9 and 11 is $V_1$; the drain voltage of the MOS FET 10 is $V_{DD}$; the resistance of the resistors 9 and 11 is R; and the resistance of a load resistor 12 is $R_L$. Assuming that the gain and input impedance of the op-amp 8 are infinite, the output voltage $V_2$ of the op-amp 8 reaches a corresponding negative level which is smaller than a gate-source voltage ($-V_{TH}$) shown in FIG. 2, when the input voltage $V_{in}$ is positive ($V_{in} \geq 0$), so that the MOS FET 10 is turned off. Therefore, if the load resistance $R_L$ is sufficiently larger than the gain setting resistance R, the input voltage $V_{in}$ appears directly as the output voltage $V_{out}$; i.e. $V_{in} = V_{out}$.

On the other hand, when the input voltage $V_{in}$ is negative ($V_{in} < 0$), the op-amp output voltage $V_2$ reaches a corresponding positive level to turn on the MOS FET 10. In this case, due to the infinite input impedance of the amplifier 8, the Kirchhoff's law applies to the junction 3 to give the following equation.

$$I_A = I_B \tag{1}$$
$$\frac{V_1 - V_{in}}{R} = \frac{V_{out} - V_1}{R}$$

where $I_A$ and $I_B$ represent currents flowing through the resistors 9 and 11, respectively.

Because the current $V_{out} - V_1/R$ flowing through the resistor 11 is equal to the sum of currents flowing through the MOS FET 10 and the load resistor 11, equation (1) is modified as:

$$\frac{V_1 - V_{in}}{R} = \frac{V_{out} - V_1}{R} = I_T - \frac{V_{out}}{R_T} \tag{2}$$

As described at page 125 of a text book entitled "MOS Field Effect Transistors and Integrated Circuits", by Paul Richman, published in 1973 by John Willey & Sons, Inc., $I_T$ is expressed as:

$$I_T = \frac{1}{2} \mu C_{ox} W/L [2(AV_1 - V_{out} - V_T)(V_{DD} - V_{out}) - (V_{DD} - V_{out})^2] \tag{3}$$

where A is the gain of an op-amp, $\mu$, $C_{ox}$, W, L, and $V_T$ are the charge mobility, gate capacity per unit area, gate width, gate length and threshold voltage of an MOS FET, respectively. It should be noted that equation 3 is applicable to both of the depletion type and enhancement type MOSFETs. Supposing $R_L >> R$, equation (2) may be modified as:

$$R\mu C_{ox} W/L \left[ -AV_{out}^2 + \left( AV_{DD} - AV_{in} - \frac{1}{R\mu C_{ox} W/L} \right) V_{out} + \left( AV_{DD} + \frac{1}{R\mu C_{ox} W/L} \right) \times V_{in} \right] = 0 \quad (4)$$

If the gain A in equation (4) is infinite, equation (4) is rewritten as:

$$V_{out} = (V_{in} - V_{DD}) V_{out} - V_{DD} V_{in} = 0 \quad (5)$$

From equation (5), the output voltage $V_{out}$ is obtained as:

$$V_{out} = -V_{in} \quad (6)$$

Equation (6) teaches that the rectifier of FIG. 1 produces a rectified voltage, at the output terminal 2, which is equal to the input voltage even when the input voltage may be negative.

It will be readily apparent that the present invention is adaptable to rectify an AC current given as the input to the terminal 1.

Figure 4:
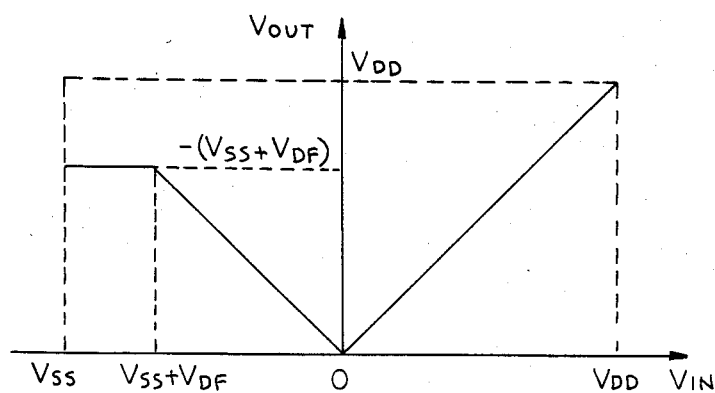
FIG. 4 is a graph showing a rectification characteristic achievable in a prior art rectifier.

The advantage of the present invention will become clear from FIG. 4 which shows a rectification characteristic which is achievable with the rectifier described in the Bowers paper, previously mentioned. In FIG. 4, due to the forward voltage drop $V_{DF}$ of the diode, the rectified output voltage becomes saturated as the input voltage $V_{in}$ increases beyond the sum $(V_{SS}+V_{DF})$ of the negative operating voltage $V_{SS}$ and voltage drop $V_{DF}$. Thus, the rectification range achieved with the rectifier shown in the paper is limited.

As has been described above, the present invention provides a full wave rectifier suited for the MOS IC fabrication using a depletion type MOS FET to achieve a wider range of rectification.

What is claimed is:

1. A full wave rectifier comprising:
   a rectifier input terminal supplied with an AC signal and a rectifier output terminal for delivering a rectified DC signal;
   operational amplifier means for amplifying the AC signal, said amplifier having an inverting input terminal, a grounded non-inverting input terminal and an output terminal;
   rectifier gain setting means including a first resistor coupled between the inverting input terminal of the amplifier and the rectifier input terminal, and a second resistor having a resistance which is the same as the resistance of the first resistor, said second resistor being coupled between the inverting input terminal of the amplifier and the rectifier output terminal; and
   depletion type MOS FET means having zero or negative threshold voltages which eliminate forward and reverse voltage, drops coupled to the output terminal of the amplifier for performing a switching operation.

2. A full wave rectifier comprising input and output terminal means with a pair of resistors coupled in series between said input and output terminal means, operational amplifier means having a pair of input terminals and an output terminal, one of said amplifier input terminals being connected to a junction point between said series connected pair of resistors and the other of said amplifier input terminal being grounded, and electronic switch means having zero or negative threshold voltages which eliminate forward and reverse voltage drops, controlled by the output of said operational amplifier, said switch means being coupled between a source of operational voltage and the output terminal of said rectifier means.

3. The rectifier of claim 2 wherein each of said pair of resistors has the same resistance.

4. The rectifier of claim 2 wherein said pair of operational amplifier input means comprises an inverting and a non-inverting terminal, means for coupling said junction point to said inverting terminal, said means for coupling system ground to said non-inverting terminal.

5. The rectifier of claim 4 wherein said electronic switching means comprises a depletion type MOS FET means.

* * * * *